United States Patent
Jessen et al.

(10) Patent No.: US 11,522,043 B2
(45) Date of Patent: Dec. 6, 2022

(54) IC WITH MATCHED THIN FILM RESISTORS

(71) Applicant: Texas Instruments Incorporated, Dallas, TX (US)

(72) Inventors: Scott William Jessen, Allen, TX (US); Tae Seung Kim, Austin, TX (US); Steven Lee Prins, Fairview, TX (US); Can Duan, Richardson, TX (US); Abbas Ali, Plano, TX (US); Erich Wesley Kinder, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 148 days.

(21) Appl. No.: 17/085,116

(22) Filed: Oct. 30, 2020

(65) Prior Publication Data
US 2021/0134939 A1    May 6, 2021

Related U.S. Application Data

(60) Provisional application No. 62/929,198, filed on Nov. 1, 2019.

(51) Int. Cl.
| | |
|---|---|
| *H01L 49/02* | (2006.01) |
| *H01L 21/8234* | (2006.01) |
| *H01L 27/12* | (2006.01) |
| *H01L 27/01* | (2006.01) |
| H01L 21/3213 | (2006.01) |
| H01L 21/311 | (2006.01) |

(52) U.S. Cl.
CPC .......... *H01L 28/20* (2013.01); *H01L 21/8234* (2013.01); *H01L 27/016* (2013.01); *H01L 27/1207* (2013.01); H01L 21/31116 (2013.01); H01L 21/32139 (2013.01)

(58) Field of Classification Search
CPC ... H01L 28/20; H01L 21/8234; H01L 27/016; H01L 27/1207; H01L 21/31116; H01L 21/32139
See application file for complete search history.

(56) References Cited

U.S. PATENT DOCUMENTS

2014/0239449 A1* 8/2014 Dirnecker ........... H01L 27/0802
257/536

OTHER PUBLICATIONS

Zhu, Zhimin, et al., "Thin Hardmask Patterning Stacks for the 22-nm Node," Proceedings of SPIE, 2009, pp. 72742K-1-72742K-7, vol. 7274, SPIE, USA.

* cited by examiner

*Primary Examiner* — Samuel A Gebremariam
(74) *Attorney, Agent, or Firm* — Jacqueline J. Garner; Frank D. Cimino (57) ABSTRACT

A method of fabricating an integrated circuit (IC) includes forming a dielectric layer on a substrate having a plurality of the IC. A thin-film resistor (TFR) layer is deposited on the dielectric layer, and an underlayer (UL) including carbon is formed on the TFR layer. A hard mask layer including silicon is formed on the UL. Masked etching of the hard mask layer transfers a pattern of a photoresist layer onto the hard mask layer to form a hard mask layer pattern. Masked etching of the UL transfers the hard mask layer pattern onto the UL to form a UL pattern. Masked etching of the TFR layer transfers the UL pattern onto the TFR layer to form a TFR layer pattern including a matched pair of TFRs. The matched pair of TFRs are generally included in circuitry configured together for implementing at least one function.

22 Claims, 8 Drawing Sheets

IC WITH MATCHED THIN FILM RESISTORS

CROSS-REFERENCE TO RELATED APPLICATIONS

This application claims the benefit of Provisional Application Ser. No. 62/929,198 filed on Nov. 1, 2019, entitled "Improving Thin Film Resistor Mismatch using a Spin On Silicon Containing Hard Mask", which is herein incorporated by reference in its entirety.

FIELD

This Disclosure relates to semiconductor integrated circuit (IC) devices having thin film resistors (TFRs).

BACKGROUND

Some IC devices include TFRs. Silicon chromium (SiCr) has been used for years in the semiconductor industry for TFRs due to its high electrical resistance in thin film form, relatively low temperature coefficient of resistance (TCR), and the ability to reliably carry relatively high current densities.

A variety of ICs utilize at least one matched pair of TFRs (matched TFRs) which are deployed in predetermined ratios of resistance, that are often electrically connected in parallel. The proper operation of these ICs generally requires that these resistance ratios be provided within narrow limits of error relative to their predetermined ratios, such as being designed to be in a one-to-one resistance ratio. While the ratios of resistance are important to the proper operation of such ICs, the individual values of resistance of the respective TFRs of the matched TFRs (their sheet resistance) are generally not important. Example ICs that implement matched TFRs which have the TFRs in a predetermined ratio include some current sources, as well as differential pairs, and analog-to-digital converters (ADCs).

SUMMARY

This Summary is provided to introduce a brief selection of disclosed concepts in a simplified form that are further described below in the Detailed Description including the drawings provided. This Summary is not intended to limit the claimed subject matter's scope.

This Disclosure includes a method of fabricating ICs that utilizes a multi-layer bottom anti-reflective coating (BARC) stack for patterning to form at least one pair of matched TFRs. The term patterning as used herein refers to photolithography and etching.

Disclosed aspects include a method of fabricating an IC having at least one matched pair of TFRs, comprising forming a dielectric layer on a substrate (e.g., a wafer). A TFR layer is deposited on the dielectric layer, and an underlayer (UL) including carbon is formed on the TFR layer. A hard mask layer including silicon is formed on the UL. Masked etching of the hard mask layer transfers a pattern of a patterned photoresist (PR) layer onto the hard mask layer to form a hard mask layer pattern. Masked etching of the UL transfers the hard mask layer pattern onto the UL to form a UL pattern. Masked etching of the TFR layer transfers the UL pattern onto the TFR layer to form a TFR layer pattern including the matched pair of TFRs.

BRIEF DESCRIPTION OF THE DRAWINGS

Reference will now be made to the accompanying drawings, which are not necessarily drawn to scale, wherein.

DETAILED DESCRIPTION

Example aspects are described with reference to the drawings, wherein like reference numerals are used to designate similar or equivalent elements. Illustrated ordering of acts or events should not be considered as limiting, as some acts or events may occur in a different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

The Disclosure recognizes for conventionally patterning for forming matched TFRs on ICs, such as comprising chromium (e.g., SiCr), or doped polysilicon, there is the problem of TFR mismatch which is difficult to reduce using conventional patterning techniques due to high reflectivity of the BARC into the PR layer above during the photolithography process. The high reflectivity can result in a different physical size (length and/or width) for two identically drawn TFRs, even when they are in close proximity, such as spaced apart about 0.5 µm to 1 µm.

Such TFR size variations for the respective TFRs in matched TFRs can result in significant deviations of the IC's functionality from the ideal case, which can limit the accuracy of the IC's functionality, such as for analog and mixed-signal ICs having at least one pair of matched TFRs, where the matching is known to be needed for good accuracy performance. Disclosed aspects solve this TFR matching problem for matched TFRs using a multi-layer BARC patterning process for forming TFRs which can help achieve low substrate reflectivity that enables improving the TFR dimension matching, such as for improving the resistance matching for matched TFRs.

For non-precision matched TFRs, generally any layout of metal 1 (Met1), polysilicon in the case of polysilicon gates for the MOS devices, and substrate (e.g., silicon) regions surrounded by deep trench (DT) isolation referred to herein as moats, are allowed underneath the TFRs. For ICs having precision matched TFRs, a periodic array of Met1 lines, polysilicon lines, and moat lines (aligned with Met1) can be positioned in the design of the IC below the TFRs to help improve the resistance matching for matched TFRs.

Figure 1:
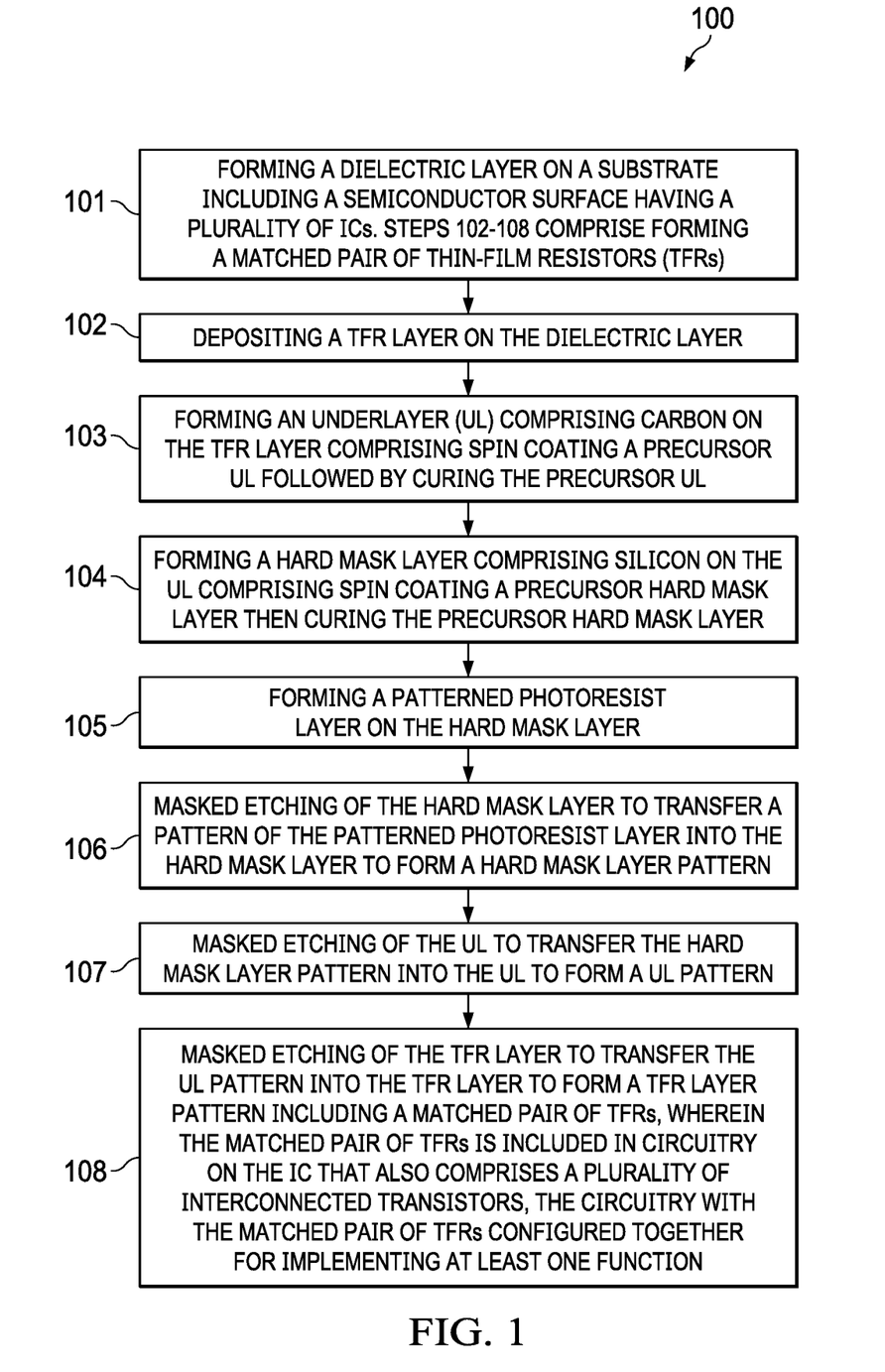
FIG. 1 is a flow chart that shows steps in an example method of fabricating ICs that utilizes a multi-layer BARC stack for patterning at least one pair of matched TFRs, according to an example aspect.

FIG. 1 is a flow chart that shows steps in an example method 100 of fabricating ICs that utilizes a multi-layer BARC stack for patterning to form at least one matched pair of TFRs, according to an example aspect. FIGS. 2A-E are cross-sectional diagrams showing simplified successive cross-sectional depictions associated with process progression for steps in method 100.

Step 101 comprises forming a dielectric layer on a substrate, where the substrate is generally in the form of a wafer including a plurality of IC in the form of IC die. At this step, each respective IC die can include components such as transistors formed in the substrate. Upon completion, the fully fabricated IC die may include circuitry that realizes and carries out a desired functionality, such as that of a digital IC (e.g., digital signal processor) or analog IC (e.g., amplifier or power converter), and in one aspect a BiCMOS (MOS and Bipolar) IC. The capability of such circuitry provided on a disclosed IC may vary, for example ranging from a simple device to a complex device. The specific functionality contained within the circuitry is not of importance to disclosed ICs.

The substrate can comprise a bulk substrate material such as silicon, or an epitaxial layer on a bulk substrate material. Alternatively, the substrate can comprise silicon-germanium other Group 4 material or other semiconductor materials including III-V and II-VI compound semiconductor materials.

The dielectric layer can comprise a TEOS-derived silicon oxide layer. However, other dielectric films can also be used including deposited silicon oxides such as comprising an organosilicate glass (OSG), a low-k dielectric (i.e., a smaller dielectric constant relative to silicon dioxide), a doped dielectric layer such as a fluorine-doped silica glass (FSG), or a silicon nitride (SiN) layer or its variants (e.g., SiON). Alternatively, in the case of polysilicon TFRs, the dielectric layer can comprise a thermal silicon oxide layer.

Figure 2A:
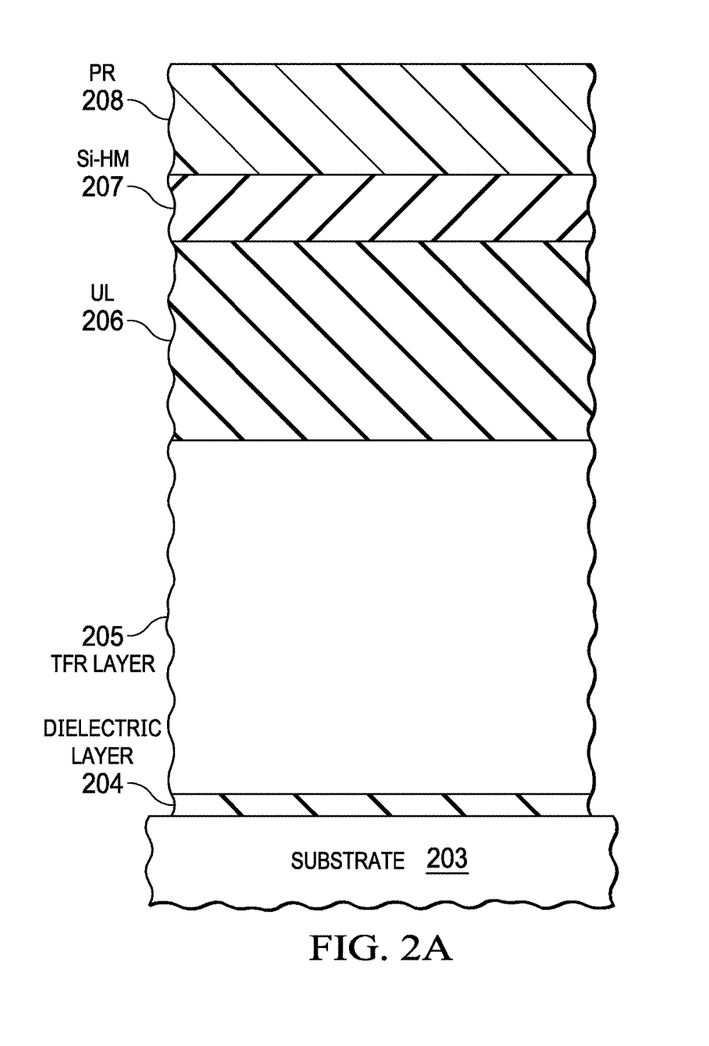
FIGS. 2A-2E are cross-sectional diagrams showing simplified successive cross-sectional depictions associated with process progression for steps in an example method of fabricating ICs that utilizes a multi-layer BARC stack for patterning at least one matched pair of TFRs.
Figure 3A:
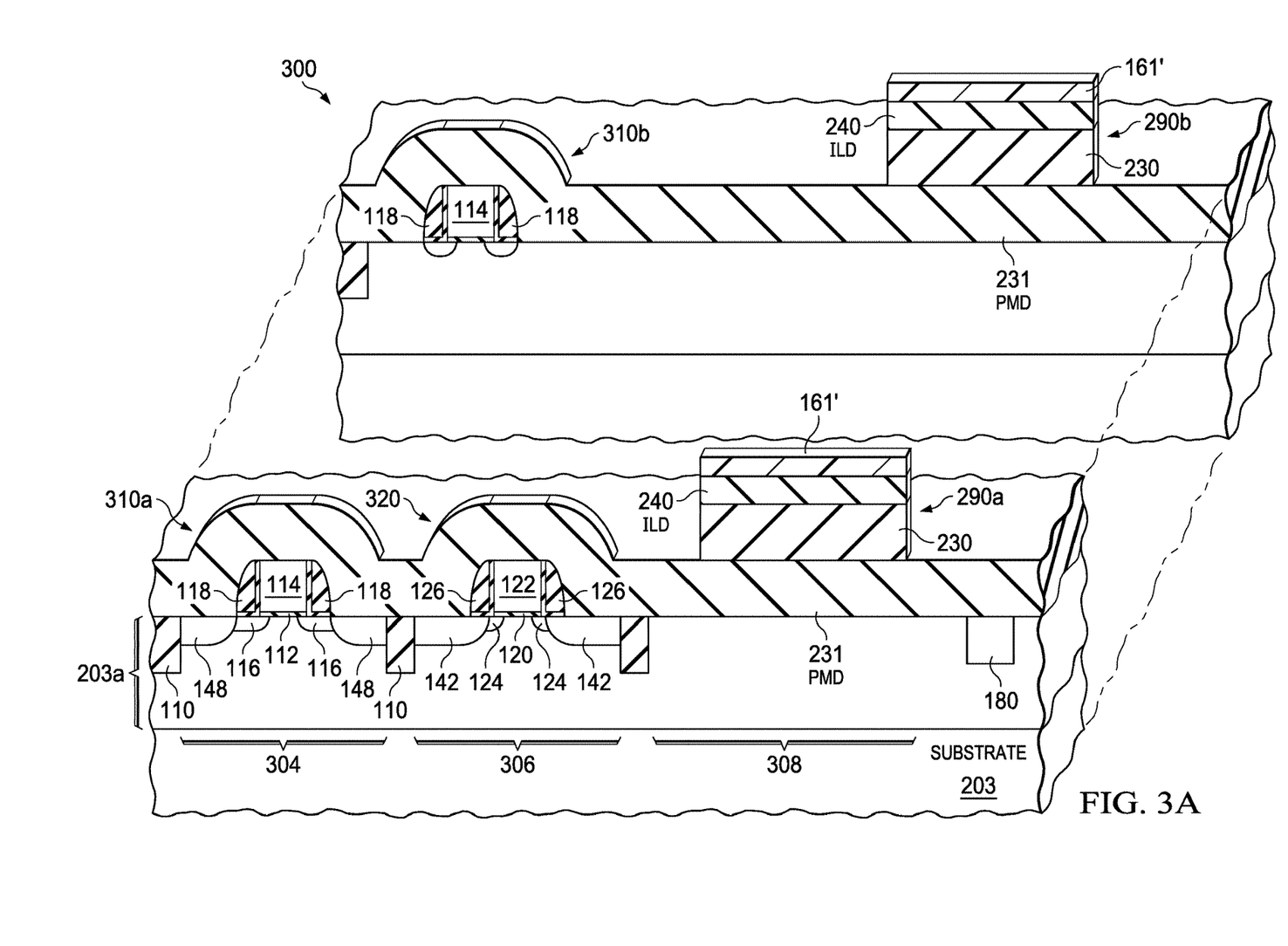
FIG. 3A is a cross-sectional view of an example IC having a matching circuit including matched TFRs.

At least one matched pair of TFRs is then formed over the dielectric layer in steps 102-108 described below. Step 102 comprises depositing a TFR layer on the dielectric layer. The deposition TFR layer process can comprise a direct current (DC) or radio frequency (RF) sputtering process. FIG. 2A shows a cross-sectional depiction for an in-process IC portion shows the TFR layer 205 on a dielectric layer 204 that is on a substrate 203. FIG. 3A described below shows a pair of matching TFRs which is generally on ICs formed by method 100. There is also shown layers formed in steps 103 to 105 described below showing a UL 206 comprising carbon (formed in step 103) on the TFR layer 205, a hard mask layer including silicon (formed in step 104) shown as Si—HM layer 207 and a layer of PR 208 (formed in step 105) on the Si—HM layer 207. The dielectric layer 204 can comprise an interlayer dielectric (ILD) layer and, in this arrangement, the TFR layer 205 can comprise silicon and chromium, and the TFR layer 205 can have a thickness from 1 nm to 50 nms.

For example, for TFR layers comprising both silicon and chromium, the composition can be expressed as $Si(x)C(y)Cr(z)$, and its alloys, where x, y, and z represent atomic percentages and y that can be zero for SiCr, as well as for NiCr and its alloys. As known in the art, TFR resistance uniformity across the IC. Including for matched pairs of TFRs may exist for conventional TFR patterning processes particularly when the TFRs are <50 nms thick.

In the case that the dielectric layer 204 comprises an ILD layer, it can comprise a TEOS-derived silicon oxide layer of a multilevel metal stack. The dielectric layer 204 can also be over a layer of thermal oxide in the case of polysilicon TFRs. The dielectric layer 204 can comprise a thermal silicon oxide layer, and in this arrangement the TFR layer 205 can comprise doped polysilicon and have a thickness from 120 nms to 300 nms, where the same polysilicon layer can be used for the gate electrodes of the MOS devices formed in the substrate 203.

As noted above, step 103 comprises forming a UL 206 comprising carbon on the TFR layer 205 comprising spin coating a precursor UL, which can be referred to as a spin-on-carbon (SOC) layer, followed by curing the precursor UL. A SOC layer is a hard mask layer that is useful for multilayer lithography processing because of its high etch resistance, low cost of ownership, low defectivity, high alignment accuracy, good gap filling, and planarization for topography.

The UL 206/SOC layer comprises a high carbon-containing polymer solution and as a coating material, where the polymers generally need to be soluble in organic solvent and insoluble after curing for coating upper layer materials. The carbon content in the UL 206 is generally >80%. A typical thickness range for the precursor UL as coated is 100 nms to 1 µm. The UL thickness following curing is essentially the same as the thickness of the as-applied precursor UL, being that at most generally <5% less after the curing. The UL 206 helps to control reflectivity of the multi-layer tri-layer BARC stack.

Step 104 comprises forming a hard mask layer comprising silicon (Si—HM layer 207) on the UL 206, comprising spin coating a precursor hard mask layer, then curing the precursor hard mask layer. The precursor UL and the precursor hard mask layer are generally cured separately to avoid mixing of these respective layers. The Si—HM layer can comprise SiC, and can have a silicon content of at least 25% by weight. The thickness of the Si—HM layer 207 can be 10 nm to 60 nm.

Figure 2B:
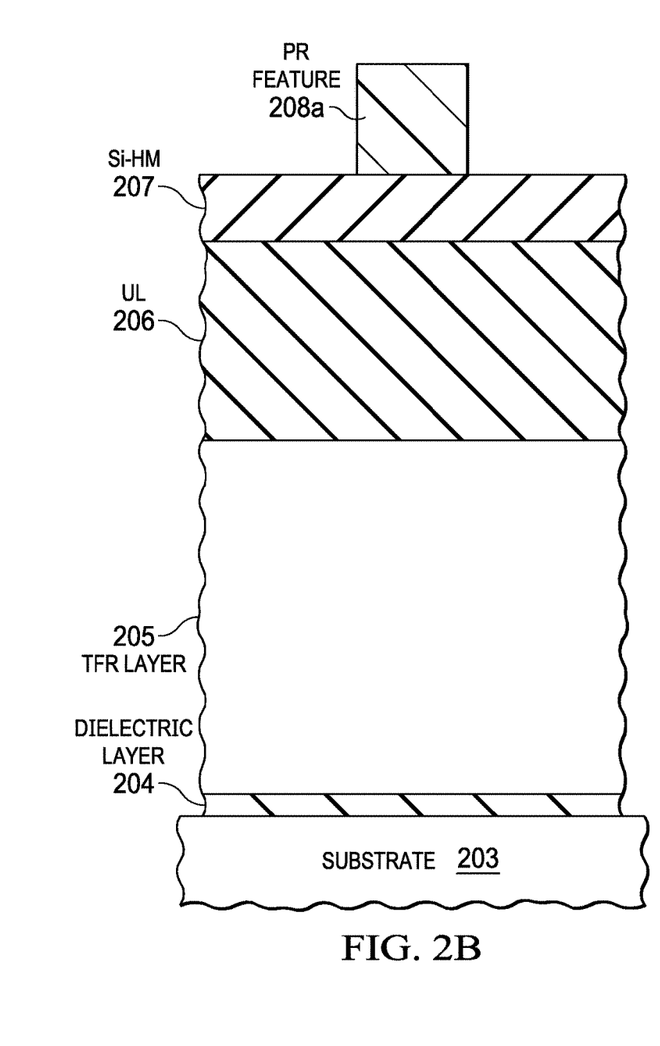
Figure 2C:
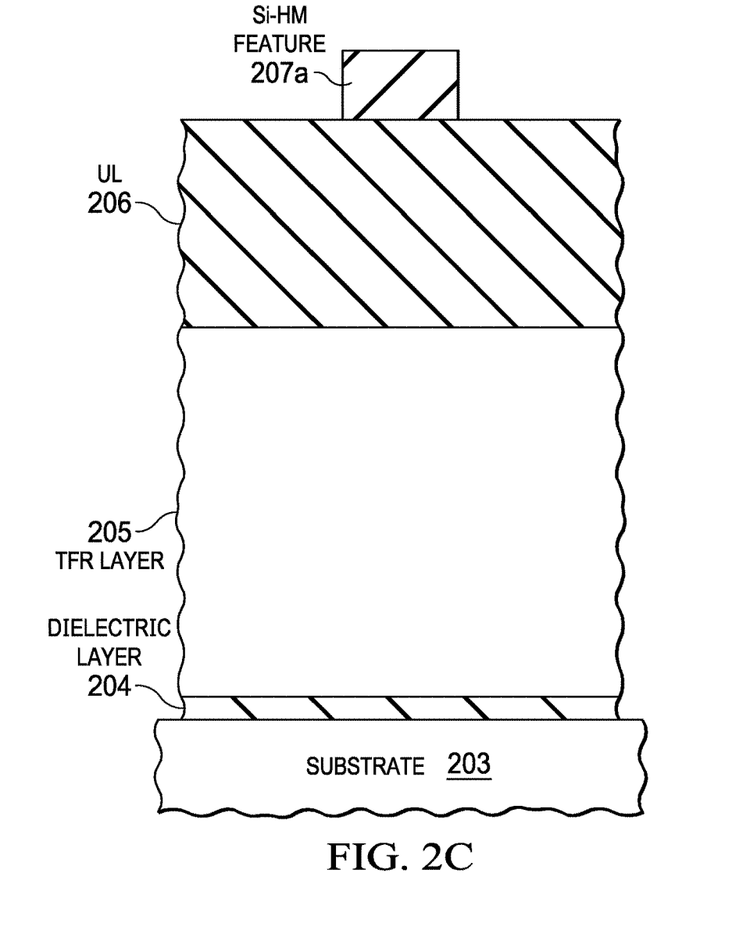

Step 105 comprises forming a patterned PR layer on the Si—HM 207 with the results of this step shown in FIG. 2B to form a PR layer pattern shown as PR feature 208a. A thickness of the PR layer 208 can generally be 50 nms to several µms, but may typically be between 50 nms and 200 nms, which is recognized as a relatively thin PR layer. A thin PR layer is recognized to improve the resolution and depth of focus (DOF) for the photolithography process.

Step 106 comprises masked etching of the Si—HM 207 to transfer a pattern of the patterned PR layer onto the Si—HM 207 to form a hard mask layer pattern, such as using a fluorinated plasma etch. Step 106 etches the Si—HM layer 207 to form a Si—HM pattern shown as Si—HM feature 207a, with the results of this step shown in FIG. 2C. The etching process for etching the Si—HM layer 207 in one specific arrangement can comprise a 2,000 W RF top power±30%, and 600 W RF bottom power±30%, a pressure of 60 mT±30%, with gas flows in units of Standard Cubic Centimeter per Minute (sccm) comprising 300 Ar, 50 $CF_4$ and 10 $O_2$, each ±30%.

Figure 2D:
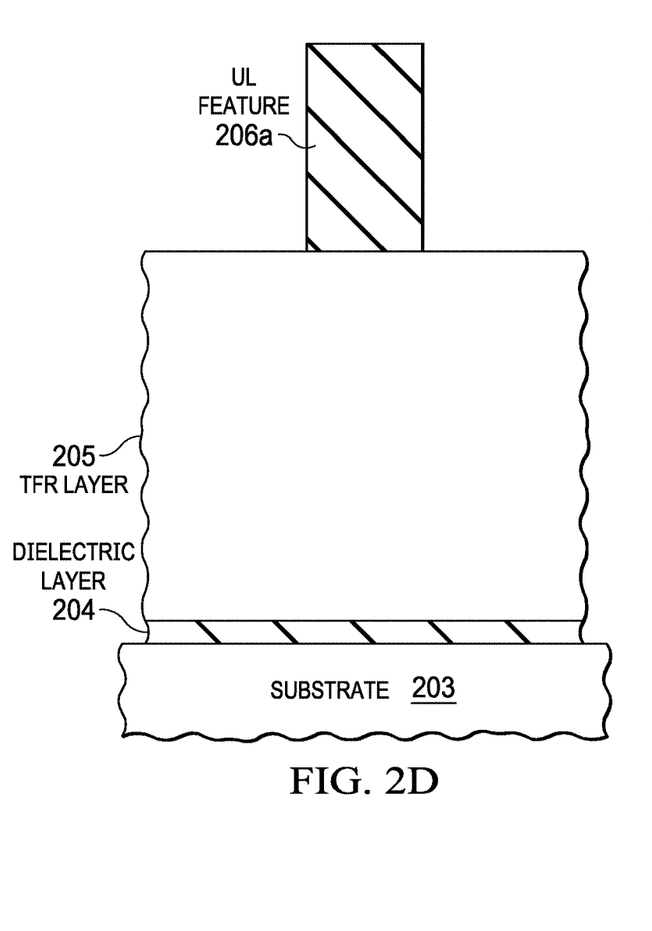

Step 107 comprises masked etching of the UL 206 to transfer the hard mask layer pattern onto the UL 206 with the results of this step shown in FIG. 2D including to form a UL pattern shown as UL feature 206a, such as using a plasma etch. The etching process for etching the UL in one specific arrangement can comprise 1,500 W RF top power±30%, and 400 W RF bottom power±30%, a pressure of 50 mT±30%, with gas flows in units of sccm comprising 300 Ar, 30 $O_2$ 10 $N_2$, and 5 $CH_2F_2$, each ±30%.

For 248 nm lithography technology, a minimum thickness for the UL 206 may be based on a corresponding photoresist height needed to etch the stack below. For 248 nm lithography technology, a UL 206 thickness of 600 nm to 1 µm can generally be used. By a 600 nm UL 206 thickness, one will generally have reduced the reflectivity of substrate essentially completely. One added benefit is that by using a non-photo active material for the UL 206 to etch an underlying stack, one generally provides an improved Line Edge Roughness (LER). Also, this allows one to increase the thickness of the UL 206 above a conventional photoresist thickness used. In a typical process, this will allow one to have ample UL 206 left to etch the underlying stack which reduces low frequency LER due to etch. Finally, using a disclosed trilayer stack (PR layer 108/Si—HM layer 207/UL 206) allows one to considerably decrease the thickness of the PR layer 108 to the relatively thin PR layer discussed above. This reduced PR layer 108 thickness can significantly improve the depth of focus (DOF) which can result in an improved critical dimension uniformity (CDU) which enables improved matching of TFRs.

Figure 2E:
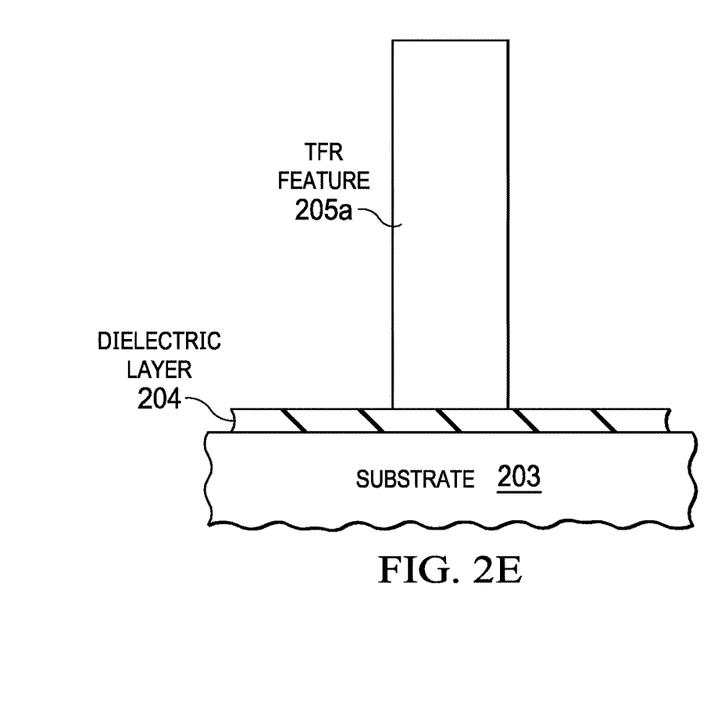

Step 108 comprises masked etching of the TFR layer 205 to transfer the UL pattern onto the TFR layer 205 to form a TFR layer pattern including the pair of matched TFRs, with the results of this step shown in FIG. 2E including TFR feature 205a. The matched pair of TFRs is included in circuitry on the IC that also comprises a plurality of interconnected transistors, the circuitry with the matched pair of TFRs configured together for implementing at least one function.

The etch used for etching the TFR layer 205 in the case of a chromium comprising TFR material such as SiCr or NiCr may comprise a plasma etch that includes flowing $O_2$, $Cl_2$, and at least one carbon-halogen gas. For example, $O_2$, $Cl_2$, and $CF_4$ with optional Ar may be used for etching SiCr. In addition, other gasses may also be used for etching the TFR layer such as $CHF_3$, or $CH_2F_2$ as a replacement for or in addition to $CF_4$, and/or $N_2$ may be used as well. The etching process for etching the TFR layer 205 in one specific arrangement can comprise 1,500 W RF top power±30%, 400 W RF bottom power±30%, a pressure of 50 mT±30%, with gas flows in units of sccm comprising 800 Ar, 20 $O_2$, 10 $N_2$, and 5 $CF_4$, each ±30%.

Example IC processing subsequent to step 108 in the case of a chromium comprising TFR can comprise the deposition of a second ILD (ILD2) layer, such as comprising a deposited silicon oxide layer. Vias can then be formed through the ILD2 layer and a hard mask layer to expose contact areas on the patterned TFR layer, and then depositing and patterning another metal layer such as a thick SiCr layer (being thick as compared to TFR layer, such as at least 10 times thicker, e.g., 50 A to 600 A thick). The thick SiCr layer, which can be called the TFR head, will be on top of the TFR layer. A plasma etch or a wet etch can then be used to form vias in the ILD2 layer for the TFR heads.

After depositing the thick SiCr layer another hard mask layer can then be deposited which is then patterned, and then this hard mask layer and the thick SiCr layer can be etched. Another ILD oxide can then be deposited, then patterned, and which can then be etched to form vias which are then filled with an electrically conductive material to form via lands, with the via lands providing contacts for contacting the thick SiCr layer over the TFR layer to complete the TFRs. The IC can then be completed by conventional back end of the line (BEOL) processing comprising forming one or more additional metal levels thereon including a top metal level. The top metal layer can comprise aluminum (or an aluminum alloy) or copper. Passivation overcoat (PO) then generally follows, followed by patterning the PO to expose bond pads. The PO layer comprises at least one dielectric layer such as silicon oxide, silicon nitride, or SiON.

Figure 2F:
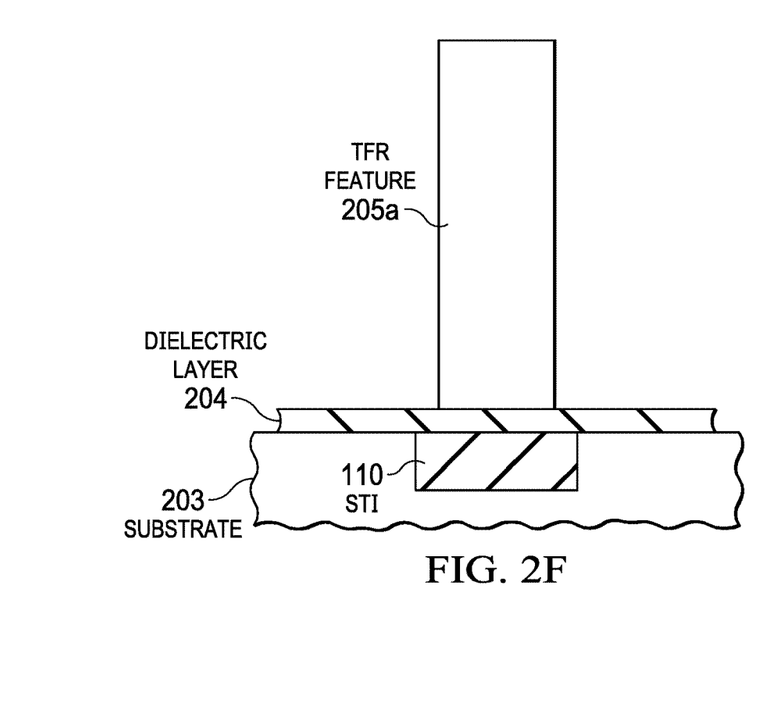
FIG. 2F is a depiction of the arrangement shown in FIG. 2E, in the particular case of the TFRs being positioned over shallow trench isolation (STI).
Figure 2G:
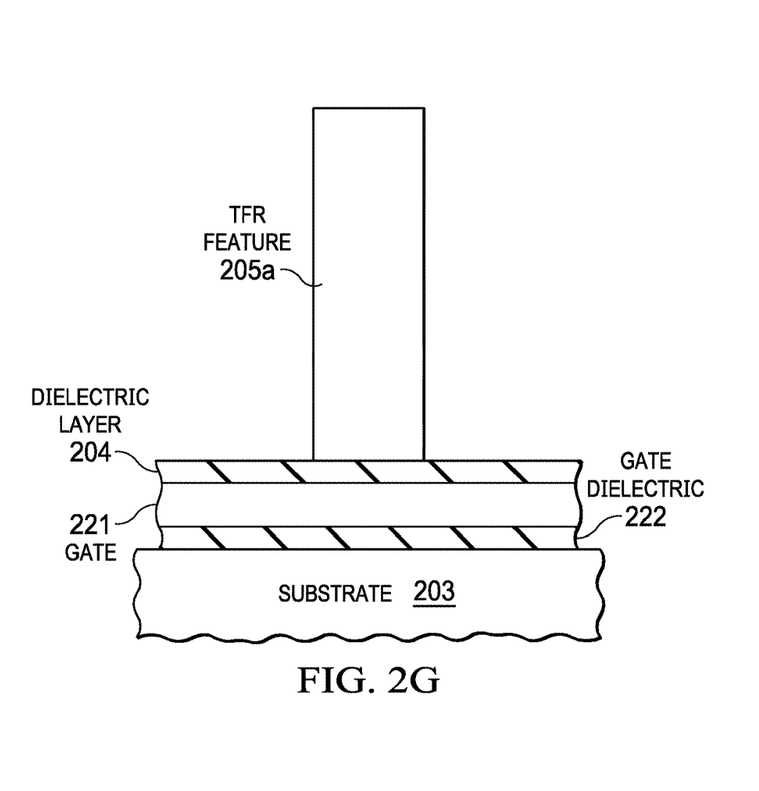
FIG. 2G is a depiction of the arrangement shown in FIG. 2E, in the particular case of the TFRs being positioned over a polysilicon gate layer.
Figure 2H:
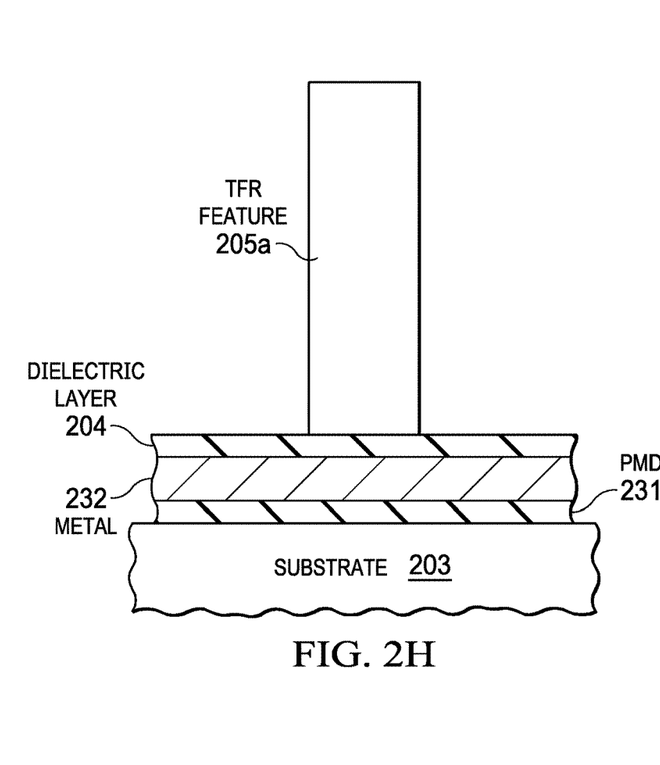
FIG. 2H is a depiction of the arrangement shown in FIG. 2E, in the particular case of the TFRs being positioned over metal.

FIG. 2F is a depiction of the arrangement shown in FIG. 2E, in the particular case of the TFRs shown as TFR feature 205a being positioned over STI 110. FIG. 2G is a depiction of the arrangement shown in FIG. 2E, in the particular case of the TFRs shown as TFR feature 205a being positioned over a polysilicon gate layer shown as 221 that is over a gate dielectric layer shown as 222. FIG. 2H is a depiction of the arrangement shown in FIG. 2E, in the particular case of the TFRs shown as TFR feature 205a being positioned over a metal layer shown as 232 that is over a pre-metal dielectric (PMD) layer 231.

FIG. 3A is a cross-sectional view of an example IC 300 having TFRs 290a, 290b, and also optionally matched NMOS transistors 310a, 310b. The IC 300 is shown formed on a substrate 203 having a semiconductor surface layer 203a with a pre-metal dielectric (PMD) layer 231 thereon. The IC 300 includes an NMOS area 304 shown having NMOS transistors 310a, 310b, a PMOS area 306 having PMOS transistors shown including a PMOS transistor 320, and a TFR area 308 having TFRs shown as TFRs 290a and 290b. The TFRs 290a and 290b are shown including a TFR layer 161' on an ILD layer 240 that may be a top ILD layer which is part of a multilayer metallization stack. Under the ILD layer 240 there is a lower metal stack shown as 230 comprising at least one metal layer (e.g., metal 1) on the PMD layer 231. The ILD layer 240 may comprise a deposited silicon oxide layer. Being over the lower metal stack 230, which is significantly thicker as compared to the gates 114, and 122 of the MOS transistors, the TFRs 290a and 290b as shown are positioned significantly above the level of the gates 114, and 122 of the MOS transistors.

Field oxide 110 is shown, for example, formed by a STI process, which can provide lateral electrical isolation on the IC 300. The field oxide although shown as STI can also be a local oxidation of silicon (LOCOS) oxide. The TFRs 290a, 290b which may be matched TFRs generally have a minimum spacing of 200 nms to 5 µms, such as a spacing of 200 nms to 1 µm.

The NMOS transistors 310a, 310b include a gate dielectric layer 112, a polysilicon (typically n+ doped) gate 114 over the gate dielectric layer 112, and gate sidewall spacers 118. The PMOS transistor 320 includes a gate dielectric layer 120, a polysilicon (typically p+ doped) gate 122 over the gate dielectric layer 120, and gate sidewall spacers 126. There are n-lightly doped drain (NLDD) regions 116 and n+ source/drain (SD) regions 148 for the NMOS transistors 310a, 310b. The PMOS transistor 320 includes p+ SD regions 142 and p− LDD (PLDD) regions 124.

Figure 3B:
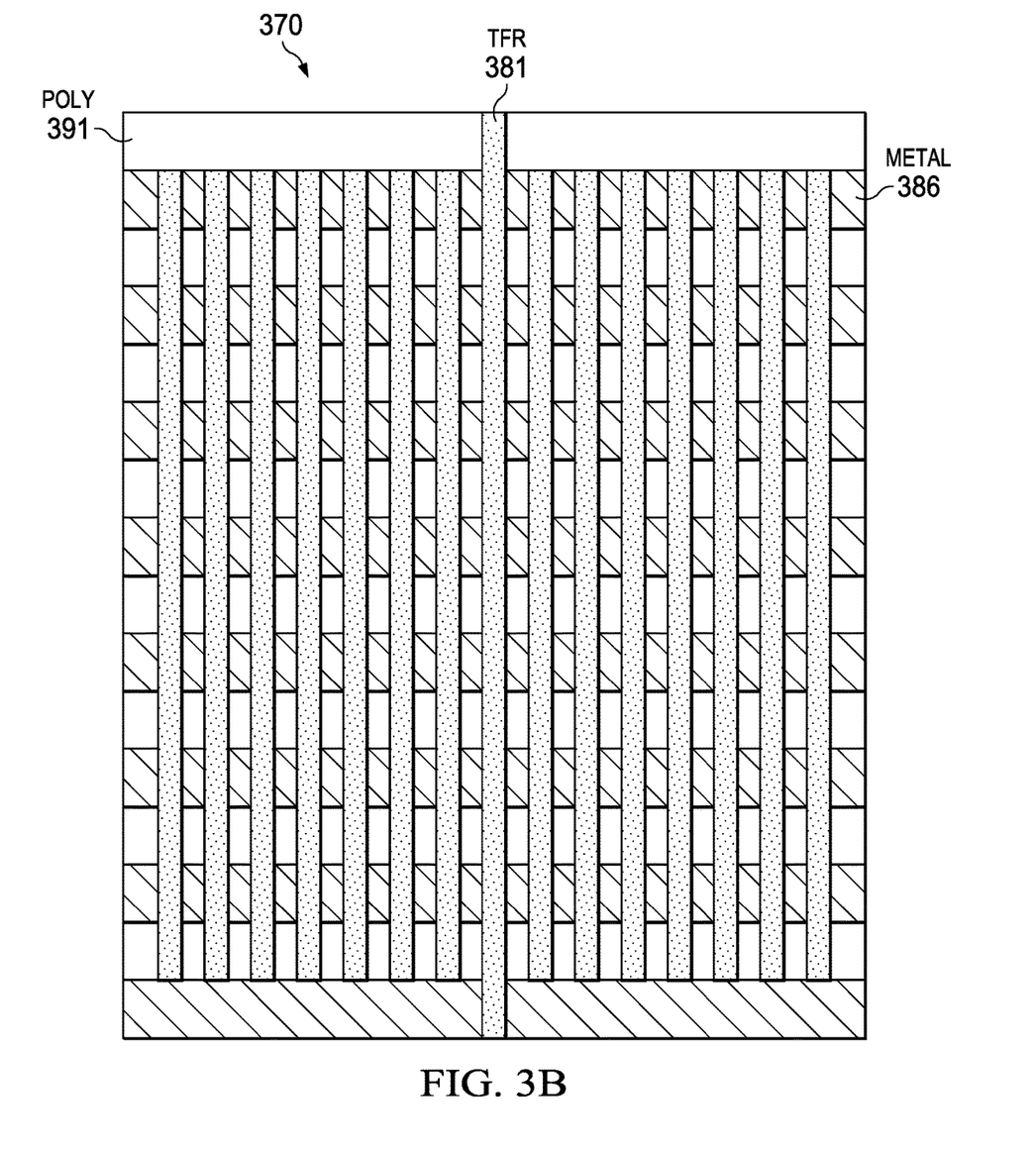
FIG. 3B is a top view depiction of a portion of an IC that has TFRs shown as TFR lines, metal lines, all over an unpatterned layer of polysilicon layer(s) used for obtaining the data in the Examples section described relative to FIG. 4.

In an actual IC, each TFR may extend over several of layers such as metal, polysilicon, and/or STI, such as shown in the portion of an IC 370 in FIG. 3B which is a top view depiction that has a pair of matched TFRs with one of the matched TFRs shown comprising TFR lines 381, and metal lines 386, all over an unpatterned polysilicon layer 391 that can also be a patterned layer. This IC portion 370 was used as test structure was used for simulation testing of the reflectivity performance of BARC stacks described relative to FIG. 4 described below. It is recognized for forming high accuracy matched TFRs, there is generally a periodic array of TFR lines that each can provide a TFR. The array of TFR lines is generally above metal lines 386, such as Met1 lines, shown in FIG. 3B being oriented perpendicular to the TFR lines 381, and the polysilicon lines (not shown in FIG. 3B). Moreover, the edge of the silicon islands which are isolated by dielectric isolation sometimes referred to as 'moat lines' may also be aligned with the metal lines 386 to help improve TFR matching.

The matched TFRs are included in circuitry on the IC which also comprises a plurality of interconnected transistors, the circuitry configured TFRs for implementing at least one function. Typically, the circuitry, including the matched TFRs, is generally coupled together by one or more of the metal levels on the IC. The matched TFRs are also generally hooked up electrically in parallel, such as shown in FIG. 3B described below which shows an IC 350 including a matching circuit 320 that includes matched TFRs. The minimum distance between the respective TFRs in the matched pair of TFRs is generally 200 nms to 5 μms.

Figure 3C:
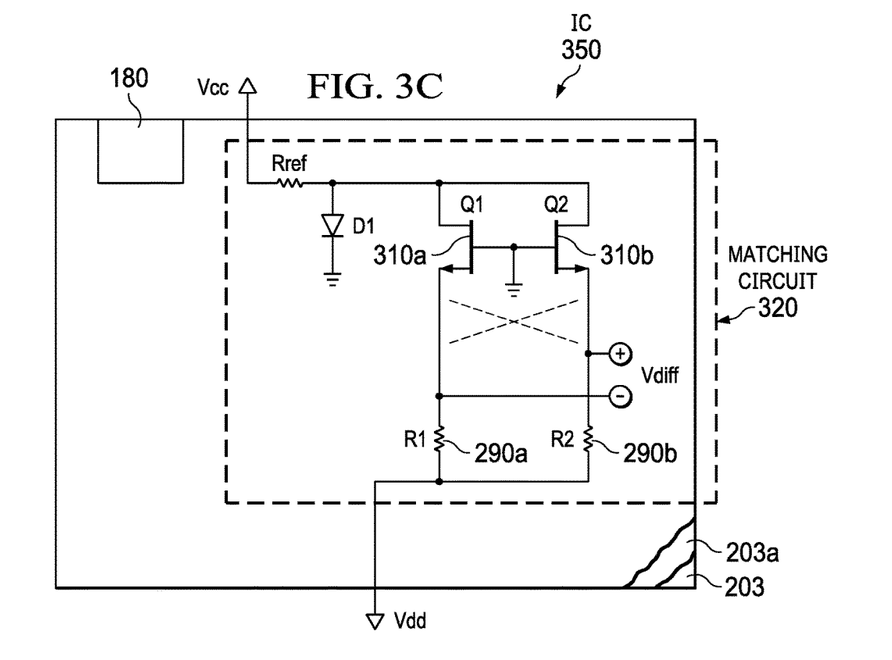
FIG. 3C is a depiction of an IC showing a portion that includes a matching circuit including matched TFRs and also matched n-channel metal-oxide semiconductor (NMOS) transistors, according to an example aspect.

FIG. 3C is a depiction of a portion of an IC 350 including a matching circuit 320 including the TFRs 290a, 290b shown in FIG. 3A configured as matched TFRs, and also the NMOS transistors 310a and 310b shown in FIG. 3A configured as matched NMOS transistors 310a and 310b (as a differential pair). The IC 300 also includes circuitry shown as block 180 that is coupled (not explicitly shown) to utilize the Vdiff signal generated by the matching circuit 320. During operation of the IC 350, the NMOS transistors 310a and 310b are being compared by the matching circuit 320.

Rref and D1 together set the voltage for the drains of NMOS transistors 310a and 310b. The gates of the NMOS transistors 310a and 310b are connected together and to a circuit ground. Currents are drawn from the sources of NMOS transistors 310a and 310b to the negative power supply shown as Vdd via matched TFRs 290a, 290b. The source voltages provide the Vdiff output which is a measure of their voltage difference.

In an ideal circuit, the TFRs 290a, 290b are perfectly matched so that the TFRs 290a, 290b have exactly the same resistance values. In that case, the matching circuit 320 is perfectly symmetrical electrically so that Vdiff is equal to 0 V. However, in practical implementations the NMOS transistors 310a and 310b are expected to be mismatched to some extent, as is the resistance of the TFRs 290a, 290b. Therefore, Vdiff is a measure of the NMOS transistors 310a and 310b mismatch voltage at the operating current level which is set by TFRs 290a, 290b. Disclosed methods may reduce the mismatch in resistance of the TFRs 290a, 290b, thus improving the matching of the matching circuit 320, and accordingly improving the performance of the ICs having matched TFRs such as IC 350.

As described above, disclosed methods of fabricating ICs that utilize a multi-layer BARC stack for patterning at least one matched pair of TFRs provide the benefit of improved TFR resistance uniformity. Disclosed methods may also enable better internal and external resistance matching for matched TFRs over a wide frequency range, and allow for more predictable transconductance and/or gain of transistors and therefore better predictability of IC performance parameters such as bandwidth, slew rate, and filter corner frequencies.

Disclosed matched TFRs can generally be formed over anywhere on the IC, including over DT isolation, STI, over gates, or over metal. In some arrangements, the area of the TFRs extend over both metal and polysilicon, which can make the photolithography more complicated as opposed to the photolithography when over a single layer.

Examples

Disclosed aspects are further illustrated by the following specific Examples, which should not be construed as limiting the scope or content of this Disclosure in any way.

The IC portion 370 shown in FIG. 3B that has TFR lines 381, and metal lines 386, all over an unpatterned polysilicon layer 391, was used for simulated testing of the reflectivity performance of BARC stacks to obtain the data shown in FIG. 4 described below. As described above, for forming high accuracy matched TFRs, there is generally a periodic array of TFR lines that each can provide a resistor.

Figure 4:
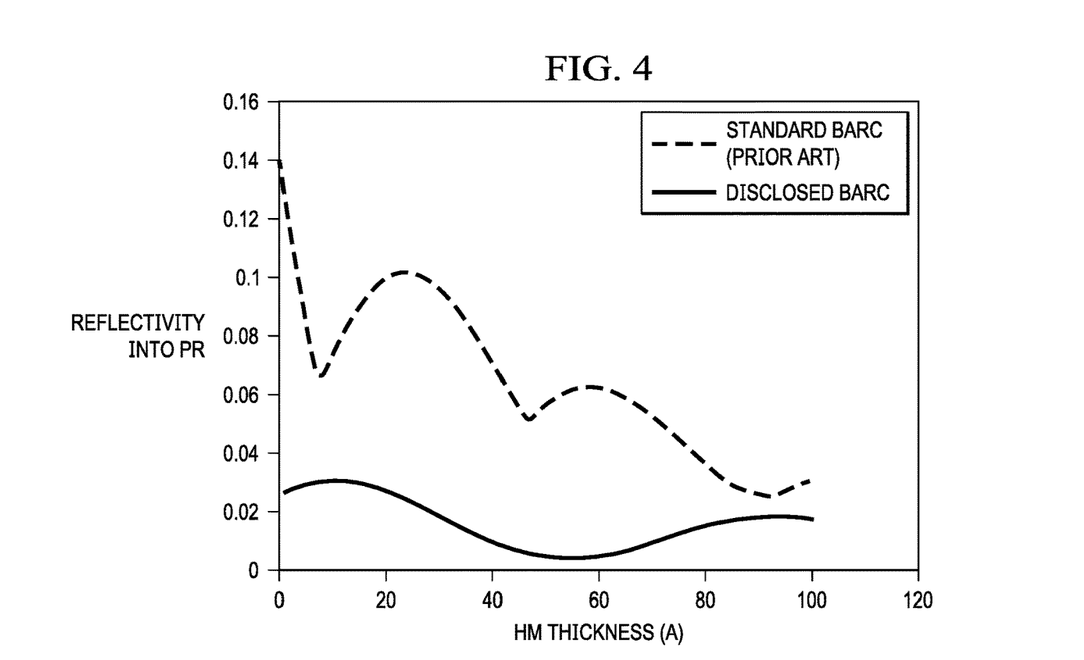
FIG. 4 is a plot showing simulated reflectivity at the interface of the PR and the hard mask layer at a 248 nm wavelength as a function of hard mask layer thickness for different BARC stacks including what is shown as a "standard BARC" and a disclosed multi-layer BARC stack.

FIG. 4 is a plot showing reflectivity at the interface of the PR and the hard mask layer at a 248 nm wavelength as a function of hard mask layer thickness for different BARC stacks including what is shown as a "standard BARC" and a disclosed multi-layer BARC stack shown is a "disclosed BARC". The standard BARC was on an 80 Å thick TEOS-derived silicon oxide layer. The disclosed multi-layer BARC comprised a hard mask comprising primarily silicon, on an SOC UL 2,000 Å thick, on an 80 Å thick TEOS-derived silicon oxide layer. It can be seen that the reflectivity into the PR layer above the BARC stack is reduced when using a disclosed multi-layer BARC stack by generally at least 50% as compared to the reflectivity into the PR layer above the standard BARC stack.

Disclosed aspects can be used to form a semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS, and MEMS.

Those skilled in the art to which this Disclosure relates will appreciate that many other aspects are possible within the scope of the claimed invention, and further additions, deletions, substitutions, and modifications may be made to the described aspects without departing from the scope of this Disclosure.

The invention claimed is:
1. A method of fabricating an integrated circuit (IC), comprising:
 forming a dielectric layer on a substrate including a semiconductor surface, and
 forming a matched pair of thin-film resistors (TFRs), comprising:
  depositing a TFR layer on the dielectric layer;
  forming an underlayer (UL) comprising carbon on the TFR layer comprising spin coating a precursor UL followed by curing the precursor UL;

forming a hard mask layer comprising silicon on the UL comprising spin coating a precursor hard mask layer then curing the precursor hard mask layer;

forming a patterned photoresist layer onto the hard mask layer;

masked etching of the hard mask layer to transfer a pattern of the patterned photoresist layer onto the hard mask layer to form a hard mask layer pattern;

masked etching of the UL to transfer the hard mask layer pattern onto the UL to form a UL pattern, and masked etching of the TFR layer to transfer the UL pattern onto the TFR layer to form a TFR layer pattern including the matched pair of TFRs.

2. The method of claim 1, wherein the respective TFRs in the matched pair of TFRs are connected electrically in parallel to one another, and have a minimum spacing of 200 nms to 5 μms.

3. The method of claim 1, wherein the dielectric layer comprises an interlayer dielectric (ILD) layer, and wherein the TFR layer comprises silicon and chromium (SiCr) and has a thickness from 1 nm to 50 nms.

4. The method of claim 1, wherein the dielectric layer comprises a thermal oxide layer, and wherein the TFR layer comprises doped polysilicon that has a thickness from 120 nms to 300 nms.

5. The method of claim 1, wherein the matched pair of TFRs each comprise a periodic array of TFR lines that are above a metal level having a plurality of metal lines, and wherein the plurality of metal lines are oriented perpendicular to the TFR lines.

6. The method of claim 1, wherein the matched pair of TFRs are over shallow trench isolation (STI).

7. The method of claim 1, wherein the matched pair of TFRs are over a gate layer.

8. The method of claim 1, wherein the matched pair of TFRs are over a metal layer.

9. The method of claim 1, wherein the mask etching of the UL comprises a plasma etch utilizing gases comprising argon, O2, N2, and a multi-element gas including carbon and fluorine.

10. The method of claim 1, wherein the masked etching of the hard mask layer comprises a plasma etch utilizing gases comprising argon, O2, and a multi-element gas including carbon and fluorine.

11. The method of claim 1, wherein the hard mask layer primarily comprises the silicon by weight, and wherein the UL primarily comprises the carbon by weight.

12. A method of fabricating an integrated circuit (IC), comprising:
    forming a dielectric layer on a substrate including a semiconductor surface, and
    forming a matched pair of thin-film resistors (TFRs), comprising:
        depositing a TFR layer on the dielectric layer;
        forming an underlayer (UL) comprising primarily carbon by weight on the TFR layer comprising spin coating precursor UL followed by curing the precursor UL;
        forming a hard mask layer comprising primarily silicon by weight on the UL comprising spin coating a precursor hard mask layer then curing the precursor hard mask layer;
        forming a patterned photoresist layer on the hard mask layer;
        masked etching of the hard mask layer to transfer a pattern of the patterned photoresist layer onto the hard mask layer to form a hard mask layer pattern,
        masked etching of the UL to transfer the hard mask layer pattern onto the UL to form a UL pattern, and
        masked etching of the TFR layer to transfer the UL pattern onto the TFR layer to form a TFR layer pattern including the matched pair of TFRs,
        wherein the respective TFRs in the matched pair of TFRs are connected electrically in parallel to one another, and have a minimum spacing of 200 nms to 5 μms.

13. The method of claim 12, wherein the dielectric layer comprises an interlayer dielectric (ILD) layer, and wherein the TFR layer comprises silicon and chromium (SiCr) and has a thickness from 1 nm to 50 nms.

14. The method of claim 12, wherein the dielectric layer comprises an interlayer dielectric (ILD) layer, and wherein the TFR layer comprises silicon and chromium (SiCr), and has a thickness from 1 nm to 50 nms.

15. The method of claim 12, wherein the dielectric layer comprises a thermal oxide layer, and wherein the TFR layer comprises doped polysilicon that has a thickness from 120 nms to 300 nms.

16. The method of claim 12, wherein a thickness of the photoresist layer is between 50 nms and 200 nms.

17. The method of claim 12, wherein the matched pair of TFRs are over shallow trench isolation (STI).

18. The method of claim 12, wherein the matched pair of TFRs are over a gate layer.

19. The method of claim 12, wherein the matched pair of TFRs are over a metal layer.

20. The method of claim 12, wherein the mask etching of the UL comprises a plasma etch utilizing gases comprising argon, O2, N2, and a multi-element gas including carbon and fluorine, and wherein the masked etching of the hard mask layer comprises a plasma etch utilizing gases comprising argon, O2, and a multi-element gas including carbon and fluorine.

21. A method of fabricating an integrated circuit (IC), comprising:
    forming a matched pair of thin-film resistors (TFRs), comprising:
        depositing a TFR layer on a substrate;
        forming a bottom anti-reflective coating (BARC) stack on the TFR layer, the BARC stack including a spin-on-carbon layer to control reflectivity;
        etching the BARC stack to pattern the spin-on-carbon layer; and
        etching the TFR layer using the patterned spin-on-carbon layer to form the matched pair of TFRs.

22. The method of claim 21, wherein the BARC stack further includes a silicon hard mask (Si-HM) on the spin-on-carbon layer.

* * * * *